United States Patent
Nag et al.

(10) Patent No.: US 8,626,469 B2
(45) Date of Patent: Jan. 7, 2014

(54) IN-SITU RC-CALIBRATION SCHEME FOR ACTIVE RC FILTER

(75) Inventors: Dipankar Nag, Hsin-Chu (TW);
Mei-Show Chen, Hsin-Chu (TW);
Chewn-Pu Jou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 321 days.

(21) Appl. No.: 12/907,586

(22) Filed: Oct. 19, 2010

(65) Prior Publication Data
US 2012/0095715 A1  Apr. 19, 2012

(51) Int. Cl.
*H03B 1/00* (2006.01)
*H03K 5/00* (2006.01)

(52) U.S. Cl.
USPC ........................................... 702/107; 327/551

(58) Field of Classification Search
USPC .......................................... 702/107; 327/551
See application file for complete search history.

(56) References Cited

U.S. PATENT DOCUMENTS

| 7,136,431 B2 | 11/2006 | Shi et al. |
| 7,596,363 B2 | 9/2009 | Mo et al. |
| 2011/0279175 A1* | 11/2011 | Kuo et al. ............... 327/553 |

OTHER PUBLICATIONS

Zou, L. et al., "A $12^{th}$ Order Active-RC Filter with Automatic Frequency Tuning for DVB Tuner Applications," IEEE Asian Solid-State Circuits Conference, Nov. 3-5, 2008, pp. 281-284, Fukuoka, Japan.

* cited by examiner

*Primary Examiner* — Alexander H Taningco
*Assistant Examiner* — Manuel Rivera Vargas
(74) *Attorney, Agent, or Firm* — Slater & Matsil, L.L.P.

(57) ABSTRACT

A method of calibrating a filter includes applying an input signal into the filter to generate an output signal, measuring a phase difference between the input signal and the output signal; determining a leading/lagging status of the phase difference; calculating a capacitor code (CAP_CODE) using the leading/lagging status; and calibrating the capacitor using the CAP_CODE.

9 Claims, 12 Drawing Sheets

Operation flow
Set a default value for CAP_CODE. Set ITERATION = 0
If( CODE_MIN < CAP_CODE < CODE_MAX)
 if( ITERATION < MAX_ITERATION)
  ITERATION= ITERATION+1
  Check    : if ( φ > 0 ) CAP_CODE = CAP_CODE - 1
       else if ( φ < 0) CAP_CODE = CAP_CODE + 1
       else exit.
 else exit.
else exit.

IN-SITU RC-CALIBRATION SCHEME FOR ACTIVE RC FILTER

BACKGROUND

Receivers are well-known components for communication systems. A receiver may include a low noise amplifier (LNA) for filtering inbound radio frequency (RF) signals, and mixers for generating intermediate frequency (IF) signals by mixing the filtered RF signals with a signal from a local oscillator.

The IF signals may be filtered by a bandpass filter (BPF). The frequency band of the BPF needs to be accurately tuned to the desirable frequency band to ensure good performance of the respective receiver. However, due to the process variation and temperature variation of the BPF, the frequency band may have big variations, and hence the BPF needs to be calibrated.

Conventionally, the BPF may be calibrated through the calibration of the resistors and/or capacitors in the BPF. The BPF were calibrated using an external calibration system external to a capacitor bank (array) of the BPF, and a capacitor bank of the external tuning system is calibrated, and the capacitor code for calibrating the capacitor array of the external tuning system is latched to the capacitor bank in the BPF, and hence the capacitor bank in the BPF is also calibrated.

When the scale of the integrated circuits becomes smaller, there is an increasingly greater intra-die mismatch between the capacitor bank of the BPF and the capacitor bank of the external tuning system even if they are on a same die. The accuracy in the calibration is thus impaired. Further, the external tuning system requires extra chip area.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 10 and 11 are frequency response of filters, wherein FIG. 11 is obtained after performing calibrations to the circuits related to FIG. 10.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel RC filter calibration method and circuits for performing the same are presented in accordance with an embodiment. The variations and the operation of the embodiments are then discussed. Throughout the various views and illustrative embodiments, like reference numbers are used to designate like elements.

Figure 1:
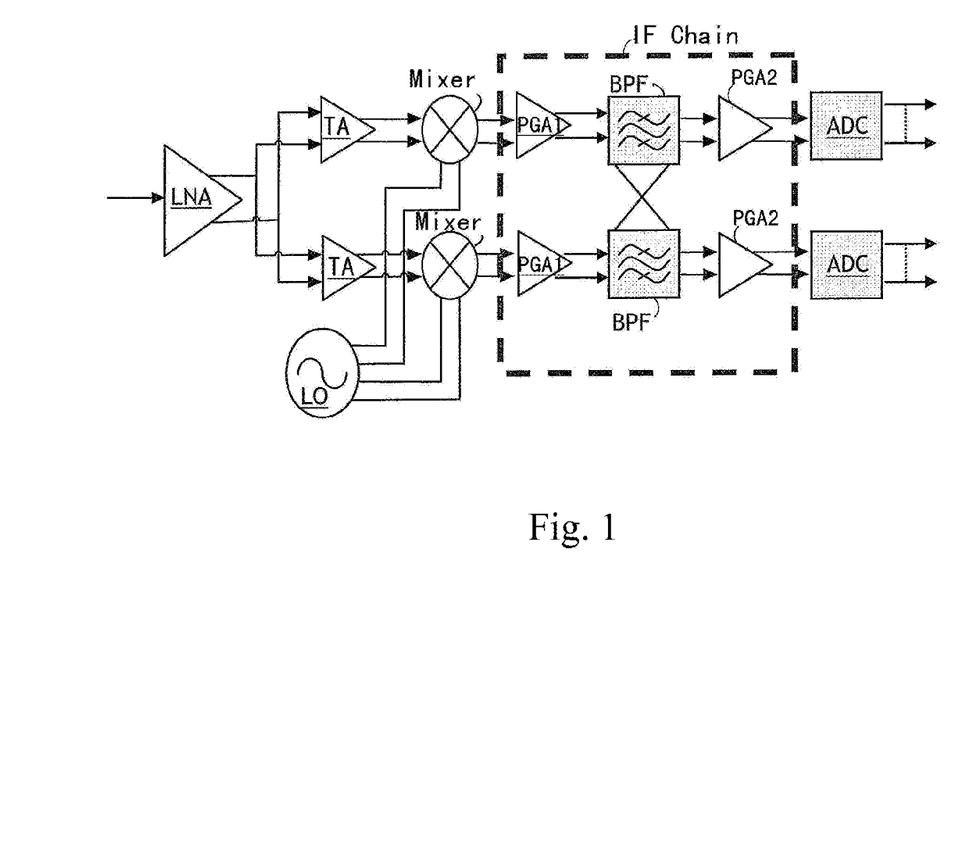
FIG. 1 illustrates a block diagram of a receiver comprising bandpass filters (BPF)

FIG. 1 illustrates an exemplary receiver, which includes an intermediate frequency (IF) chain that comprises a capacitor (not shown in FIG. 1, please refer to FIG. 2) to be calibrated. It is noted that the filter in the receiver shown in FIG. 1 is merely an exemplary embodiment, while the calibration scheme provided by the embodiments may be applied to the calibration of any other RC filter. The receiver includes a low noise amplifier (LNA) for filtering inbound radio frequency (RF) signals, transconductance amplifiers (TA), and mixers. The mixers generate intermediate frequency (IF) signals by mixing the RF signals received from the TAs with signals generated from a local oscillator (LO).

The IF signals are provided to an IF chain, which includes programmable gain amplifiers PGA1 that amplify the IF signals and transfer the amplified IF signals to bandpass filters BPF, which filter the IF signals. Programmable gain amplifiers PGA2 further amplify the filtered IF signals and output the signals to analog-to-digital converters ADC.

Figure 2:
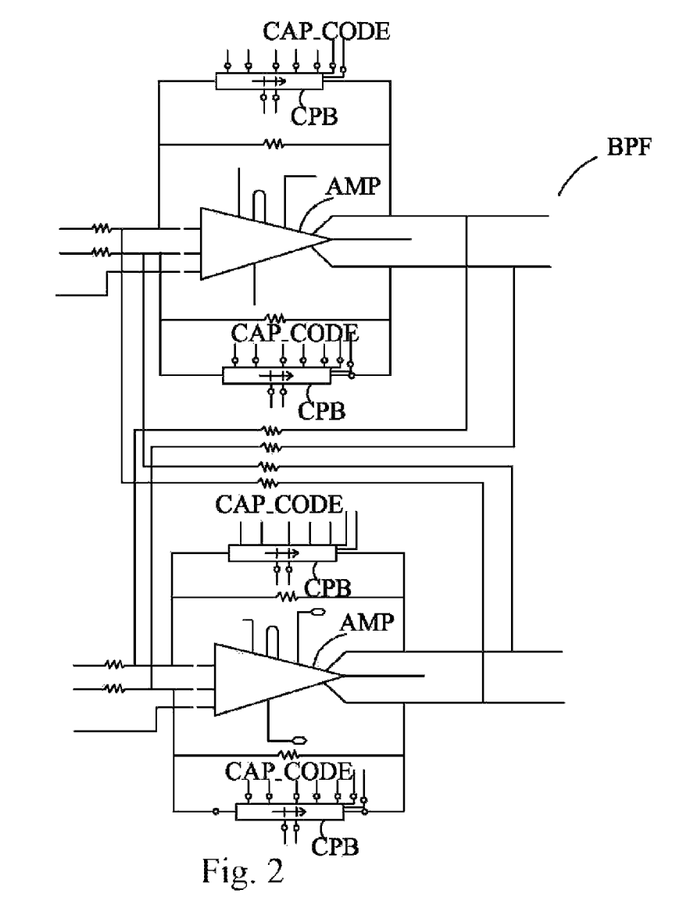
FIG. 2 illustrates a portion of an exemplary capacitor bank (CPB) that is calibrated through a capacitor code (CAP_CODE)

A portion of an exemplary bandpass filter BPF is illustrated in FIG. 2, which shows a portion of a poly-phase BPF comprising amplifier AMP, which is coupled to capacitor bank(s) CPB. The poly-phase BPF may include more than one of the components shown in FIG. 2, although only one is shown. Each of capacitor banks CPB, which includes a plurality of sub-capacitors therein, is operated by a capacitor code (CAP_CODE) to turn on a desirable number of sub-capacitors built therein, so that the capacitance of the resulting capacitor bank CPB is changed. By calibrating capacitor bank(s) CPB, the phase of the signal outputted by bandpass filters BPF is shifted. When the IF signals received by the IF chain (referred to as FILTER_IN signals hereinafter) is in phase with the IF signals outputted by the IF chain, the bandpass filter BPF is considered as being successfully calibrated.

Figure 3:
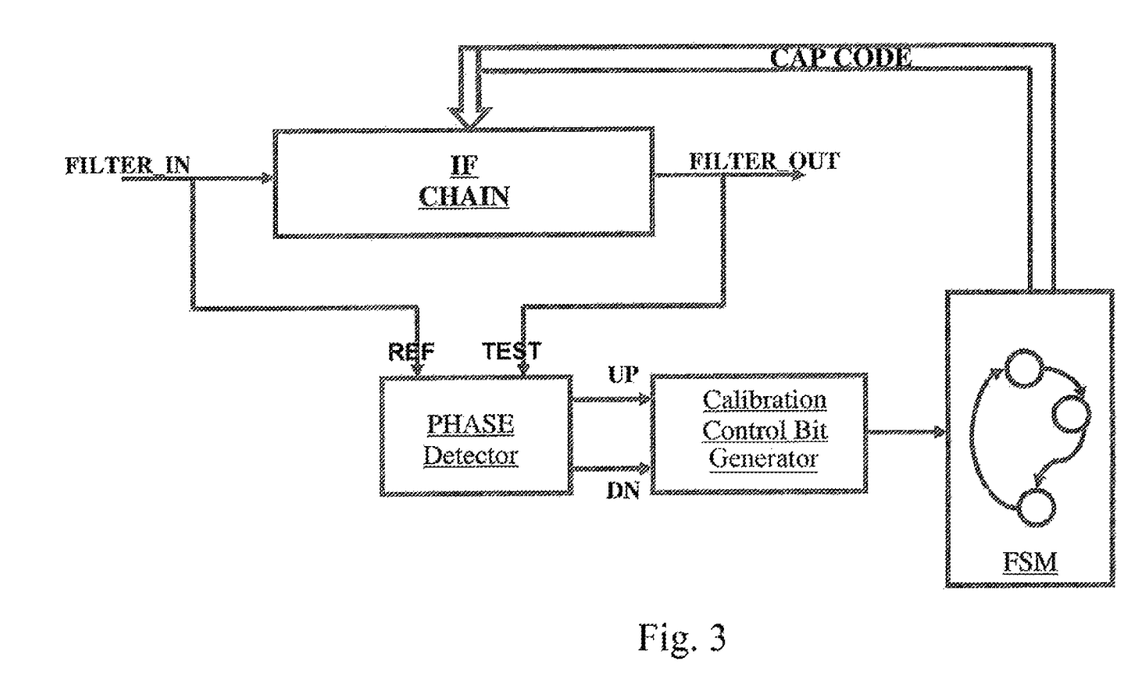
FIG. 3 illustrates an architecture of a filter calibration circuit.

An architecture of a calibration system for calibrating the capacitance of bandpass filter BPF (for example, in the IF chain as shown in FIG. 1) is illustrated in FIG. 3. During the calibration, the IF chain receives a FILTER_IN signal, which is shown as waveform FILTER_IN in FIG. 8. The FILTER_IN signal passes through the IF chain and the bandpass filter(s) BPF therein (FIG. 1), and a FILTER_OUT signal is generated by the IF chain and the respective bandpass filter BPF. The FILTER_OUT signal has a same frequency as, and may have a phase different from, that of the FILTER_IN signal. An exemplary FILTER_OUT signal is also illustrated as waveform FILTER_OUT in FIG. 8. The FILTER_IN signal and the FILTER_OUT signal, which may be differential signals, may then be converted to single-ended reference and test signals, which are denoted as REF and TEST, respectively. The phases of the REF and TEST signals are then compared with each other to determine a phase difference between the REF and TEST signals, and to determine which of the REF and TEST signals leads in phase. Throughout the description, which of the REF and TEST Signals leads in phase is also referred to as a leading status of the phases. It is appreciated that the leading status of the REF and TEST signals is also the leading status of FILTER_IN and FIL- TER_OUT signals. The comparison of the phases is performed using a phase detector. If the phase of the REF signal leads the phase of the TEST signal, UP pulses are generated. Conversely, if the phase of the REF lags the phase of the TEST signal, DN (which means "down") pulses are generated. A calibration control bit generator then generates calibration control bits according to the UP pulses and DN pulses.

A finite state machine (FSM) then, according to the calibration control bits, generates a capacitor code (CAP_CODE) for controlling the capacitor bank CPB in the BPF (which may further be located in the IF chain, please refer to FIGS. 1 and 2). The loop/iteration as shown in FIG. 3 is repeated so that the CAP_CODE may be changed (or not changed) in each loop, until capacitor band CPB has a desirable capacitance, so that the FILTER_IN and the FILTER_OUT signals are in phase, as shown as waveforms FILTER_IN and FILTER_OUT, respectively, in FIG. 9. In each of the loop/iteration, the CAP_CODE is changed at most by 1, and may possibly be unchanged. When the FILTER_IN and the FILTER_OUT signals are in phase, the phase difference $\phi$ is small enough and can be ignored. The CAP_CODE is thus not changed for a certain number of loops, and the calibration is stopped.

Figure 4:
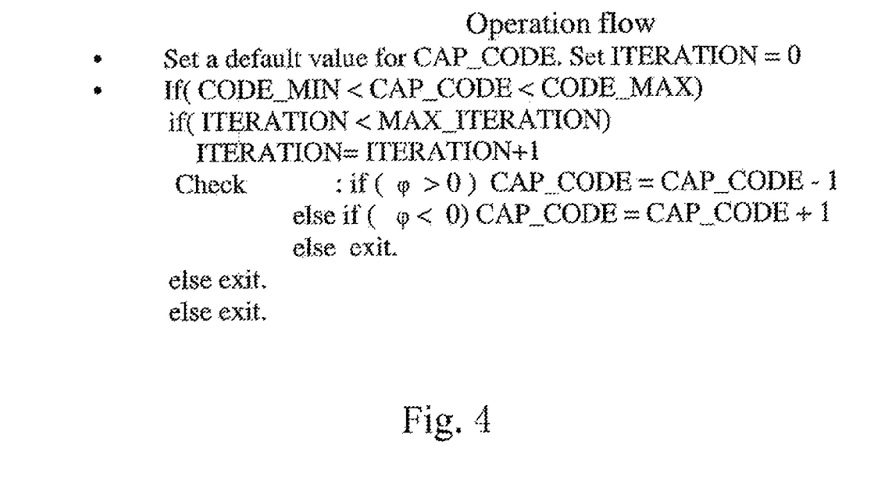
FIG. 4 illustrates an operation flow for calibrating a capacitor in a filter.

The operation flow of the architecture may be shown in FIG. 4. In the beginning of the calibration, the CAP_CODE is set to a default value, which is between a minimum CAP_CODE (CODE_MIN) and a maximum CAP_CODE (CODE_MAX). CODE_MIN and CODE_MAX are determined by the physical structures of the capacitor bank CPB (refer to FIG. 2). The number of iterations of the process flow is also recorded as ITERATION. In each of the iterations, the phase difference $\phi$ between REF and TEST signals is determined by the phase detector (refer to FIG. 3), and if $\phi$ is a non-zero value, the CAP_CODE is changed (either increased or decreased) according to the sign (">0" or "<0") of phase difference $\phi$ in order to shift the phase of the FILTER_OUT signal, so that phase difference $\phi$ may be reduced. The sign of phase difference $\phi$ also reflects the leading status of REF and TEST signals. In each iteration, the CAP_CODE is increased or decreased by one, or not changed. The operation flow stops either when the FILTER_IN and the FILTER_OUT signals are in phase, or a pre-set (maximum) number of iterations have been performed. In a possible scenario, the maximum number of iterations is reached if phase difference $\phi$ swings back-and-forth between positive and negative values in consecutive iterations, which are also an indication that the calibration is finished.

Figure 5:
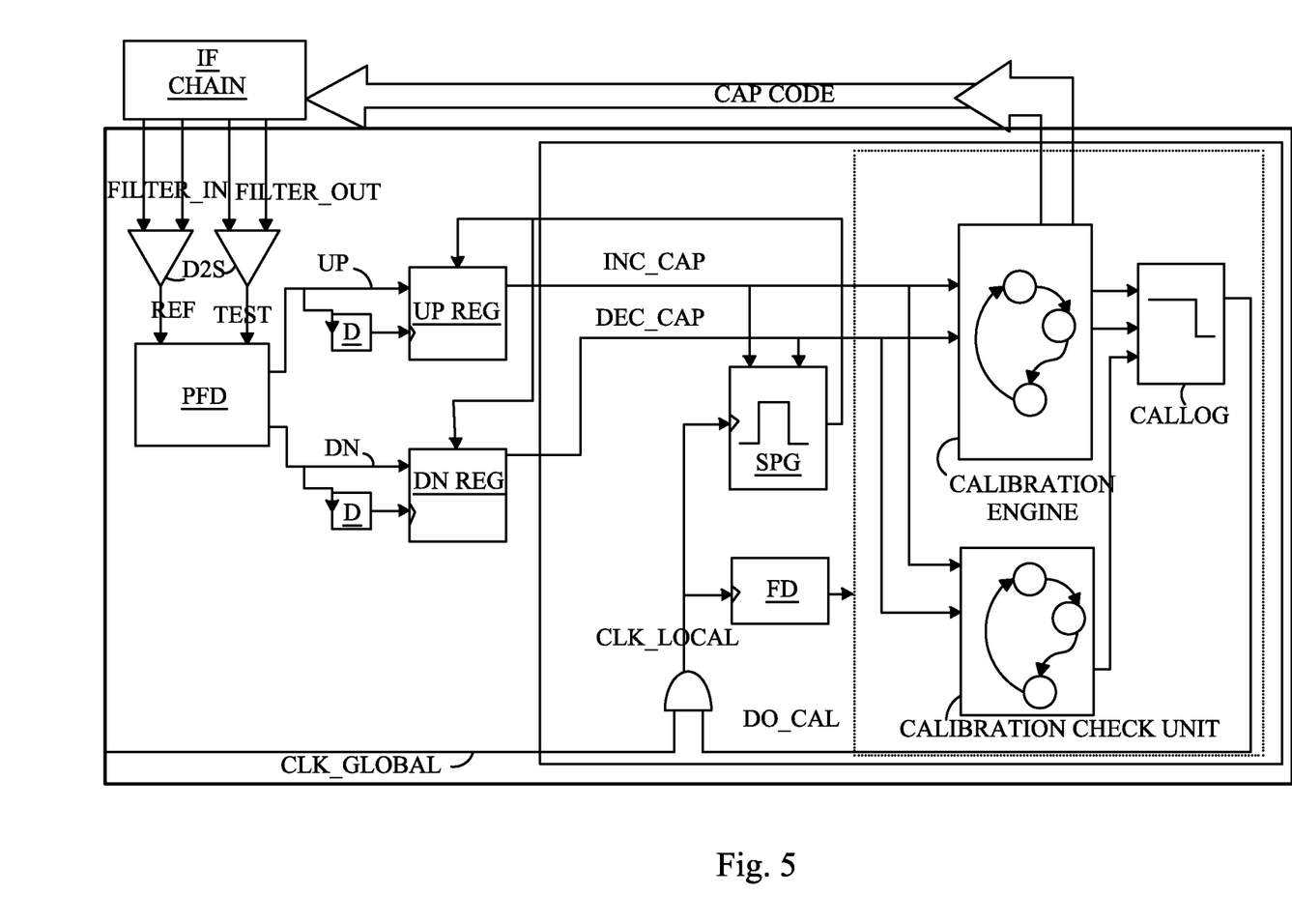
FIG. 5 illustrates a block diagram of a circuit in accordance with an embodiment, wherein the circuit implements the architecture shown in FIG. 3.

FIG. 5 illustrates an exemplary circuit block diagram implementing the architecture in FIG. 3 and the operation flow in FIG. 4. The calibration circuit includes differential-to-single-ended signal converters D2S for converting the differential FILTER_IN and FILTER_OUT signals to single-ended digital signals REF and TEST, respectively. Phase detector PFD (also referred to as a phase frequency detector) comprises inputs for receiving REF and TEST signals, and is configured to compare the phases of signals REF and TEST. If the phase of the REF signal leads the phase of the TEST signal, pulses (referred to UP pulses hereinafter) are generated and outputted to register UP_REG through a first output, while no pulse is outputted to register DN_REG through a second output, or the pulses outputted to the second output have very short pulse widths. Conversely, if the phase of the REF lags the phase of the TEST signal, pulses (referred to DN pulses hereinafter) are generated and outputted to register DN_REG through the second output, while no pulse is outputted to register UP_REG through the first output, or pulses outputted to the first output have very short pulse widths. The widths of the UP pulses and the DN pulses are compared with the delay time of delay cells D. If the widths of the UP pulses and the DN pulses are greater than the delay time of delay cells D, it is determined that phase difference $\phi$ is great enough, and should not be ignored. Accordingly, the respective registers UP_REG and/or DN_REG will increase their register values. Otherwise, if the widths of the UP pulses and the DN pulses are smaller than the delay length of delay cells D, the respective UP and DN pulses are ignored, and the respective registers UP_REG or DN_REG will not change their values.

Sync pulse generator SPG determines the time the values in registers UP_REG and DN_REG should be processed and cleared. Sync pulse generator SPG is operated by global clock CLK_GLOBAL, which has a lower frequency than the frequency of FILTER_IN signal. Accordingly, during one CLK_GLOBAL cycle, multiple cycles of comparisons may be performed by phase frequency detector PFD, and the values in each of registers UP_REG or DN_REG may be greater than one. The values in registers UP_REG and DN_REG are used to determine the values of calibration control bits INC_CAP and DEC_CAP. For example, if the value of register UP_REG is greater than a pre-determined value, calibration control bit INC_CAP (meaning "increase the capacitor code") is set to 1, otherwise it is set to 0. If the value of register DN_REG is greater than the pre-determined value, calibration control bit DEC_CAP (meaning "decrease the capacitor code") is set to 1, otherwise, it is set to 0. After calibration control bits INC_CAP and DEC_CAP are set, sync pulse generator SPG clears registers UP_REG and DN_REG.

The calibration engine, as a part of the finite state machine FSM (refer to FIG. 3), determines the CAP_CODE based on the value of calibration control bits INC_CAP and DEC_CAP. The calibration engine is driven by frequency divider FD, which may generate a clock with a frequency a half of the frequency of CLK_GLOBAL. In an embodiment, if calibration control bit INC_CAP is 1, the calibration engine increases the previous CAP_CODE by 1, and sends the new CAP_CODE to the IF chain. If calibration control bit DEC_CAP is 1, the calibration engine decreases the previous CAP_CODE by 1, and sends the new CAP_CODE to the IF chain. Accordingly, the capacitor bank CPB (FIG. 2) in filter BPF (FIG. 1) of the IF chain is calibrated according to the received CAP_CODE, and the phase of the FILTER_OUT signal is advanced or pulled back. If calibration control bits INC_CAP and DEC_CAP have equal values, the CAP_CODE is kept unchanged. After the CAP_CODE is sent to the IF chain, a new loop of calibration may be performed, and the loops may be repeated.

The calibration check unit, which is also a part of the FSM as in FIG. 3, is used to check whether the calibration has finished or not. The calibration check unit checks the values of calibration control bits INC_CAP and DEC_CAP, and if these values are not changed in a pre-determined (for example, 4) loops of CAP_CODE determination process, the calibration check unit sends a signal to unit CALLOG, which sets signal "Do-Cal" to "false" to stop local clock signal CLK_LOCAL, and the calibration is stopped. In other words, if the calibration engine sends out the same CAP_CODE for more than four times, it is determined that the calibration is successful, and the calibration will be stopped.

Figure 6:
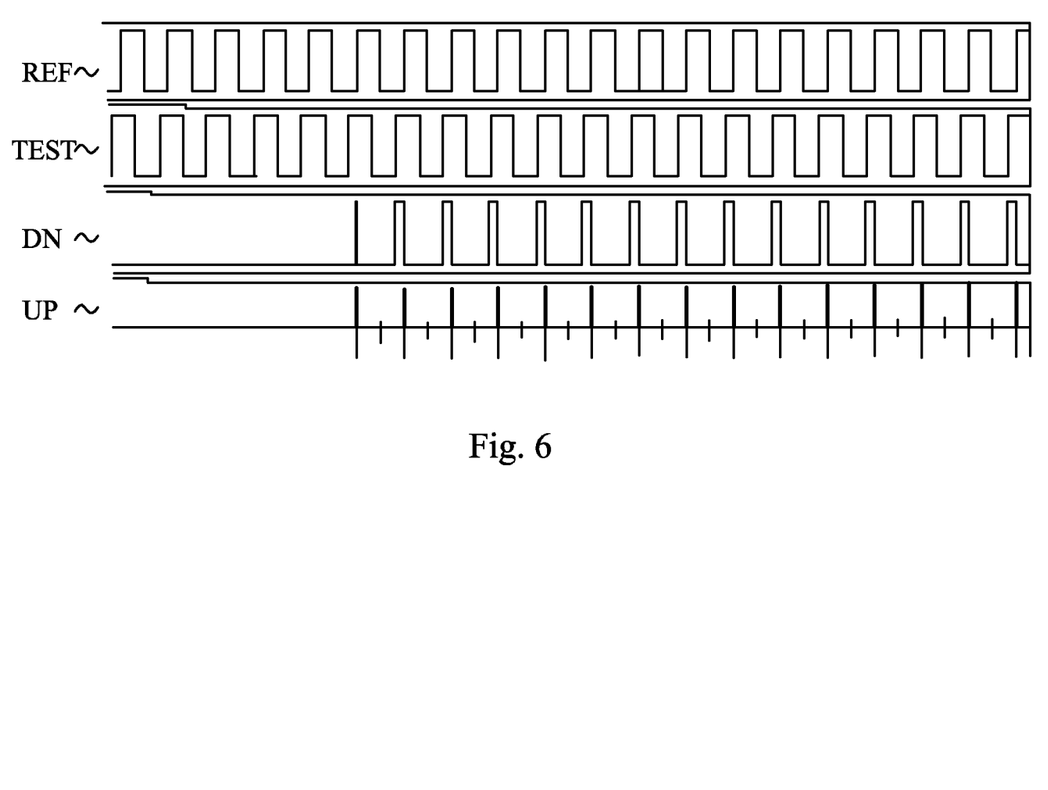
FIGS. 6 and 7 are pre-calibration simulation results and post-calibration simulation results, respectively.
Figure 7:
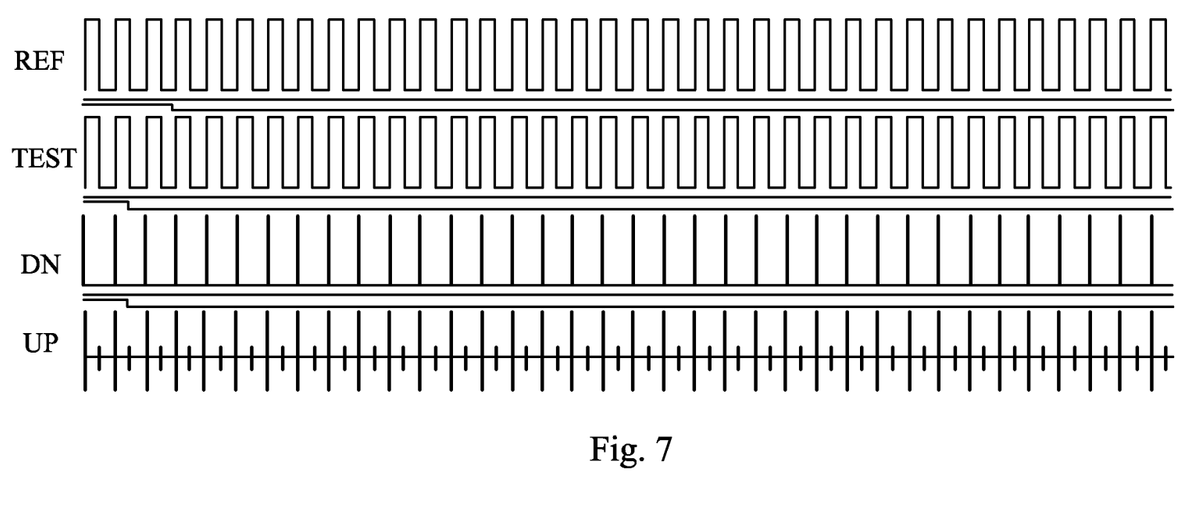
Figure 8:
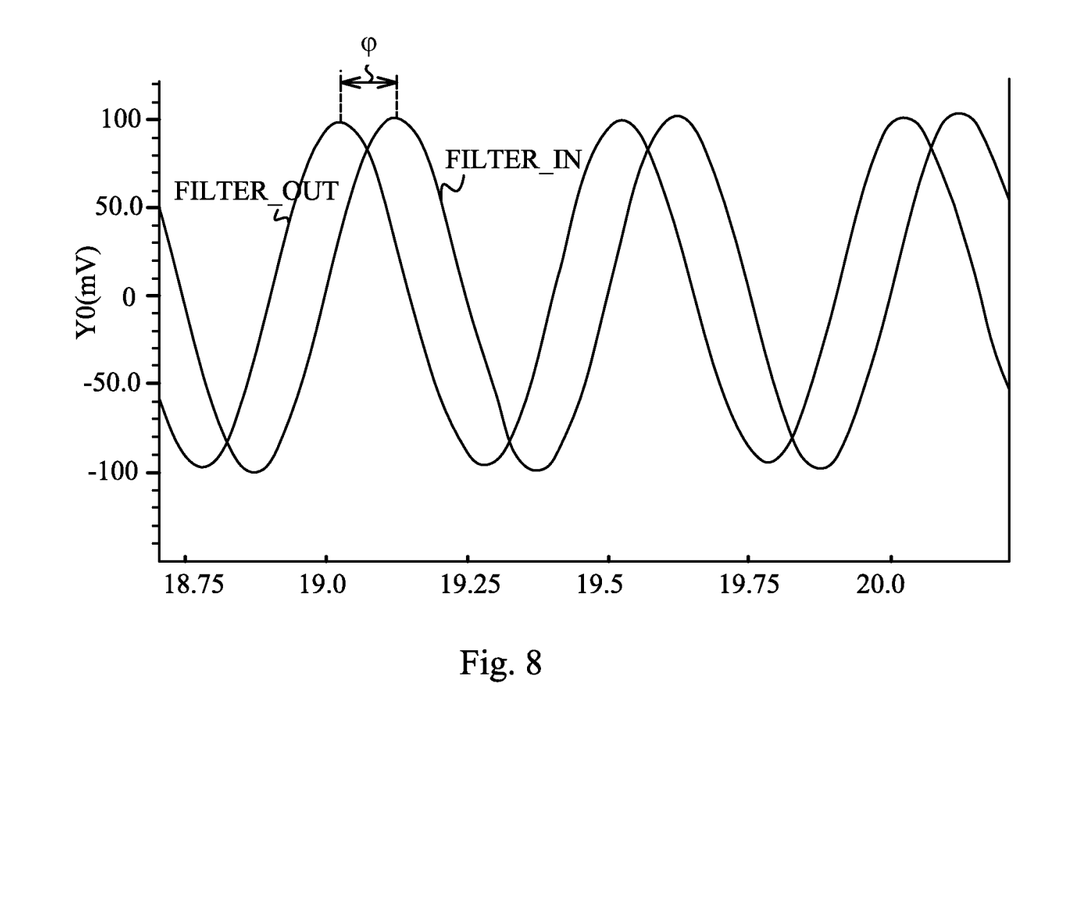
FIGS. 8 and 9 are waveforms of input and output signals of an filter, wherein the waveforms in FIGS. 8 and 9 are pre-calibration results and post-calibration results, respectively.
Figure 9:
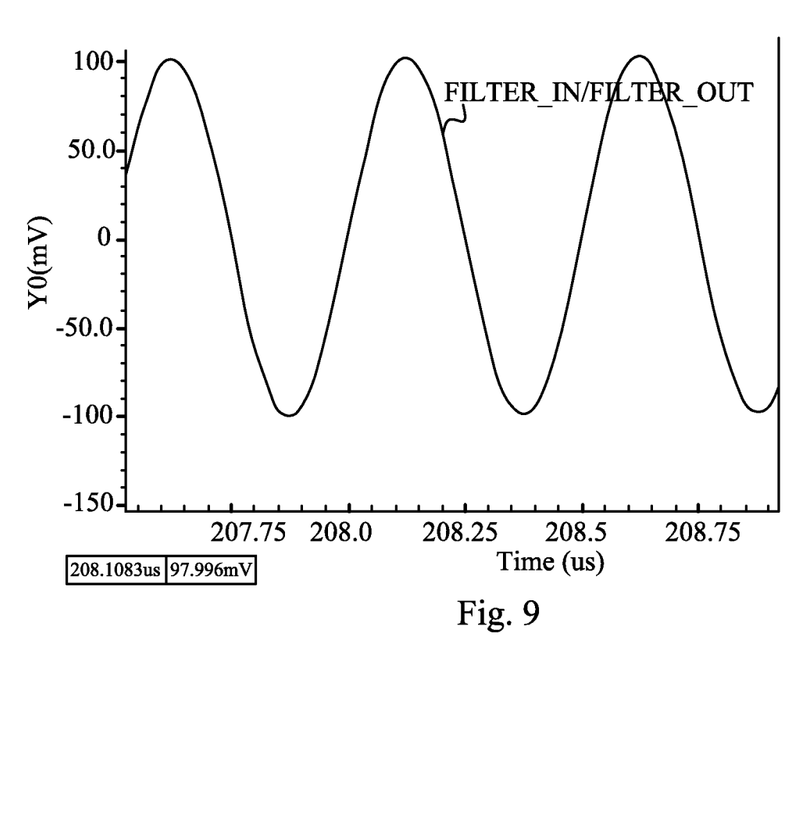

FIGS. 6 and 7 are exemplary simulated signals obtained from the circuit shown in FIG. 5, wherein the REF, TEST, UP pulses, and the DN pulses are illustrated. FIG. 6 illustrates the pre-calibration results. It is observed that the REF signal lags the TEST signal (the corresponding FILTER_IN and FIL- TER_OUT signals are shown in FIG. 8). The DN pulses are thus generated, whose pulse widths are greater than the delay time of delay cells D in FIG. 4. The UP pulses, if any, have very narrow pulses, and hence are ignored. After the calibration, as shown in FIG. 7, the REF signal and the TEST signal are in phase (the corresponding FILTER_IN and FILTER_OUT signal are shown in FIG. 9). After the calibration, as shown in FIG. 7, both UP and DN pulses that are generated in subsequent loops have very narrow widths, and will be ignored.

Figure 10:
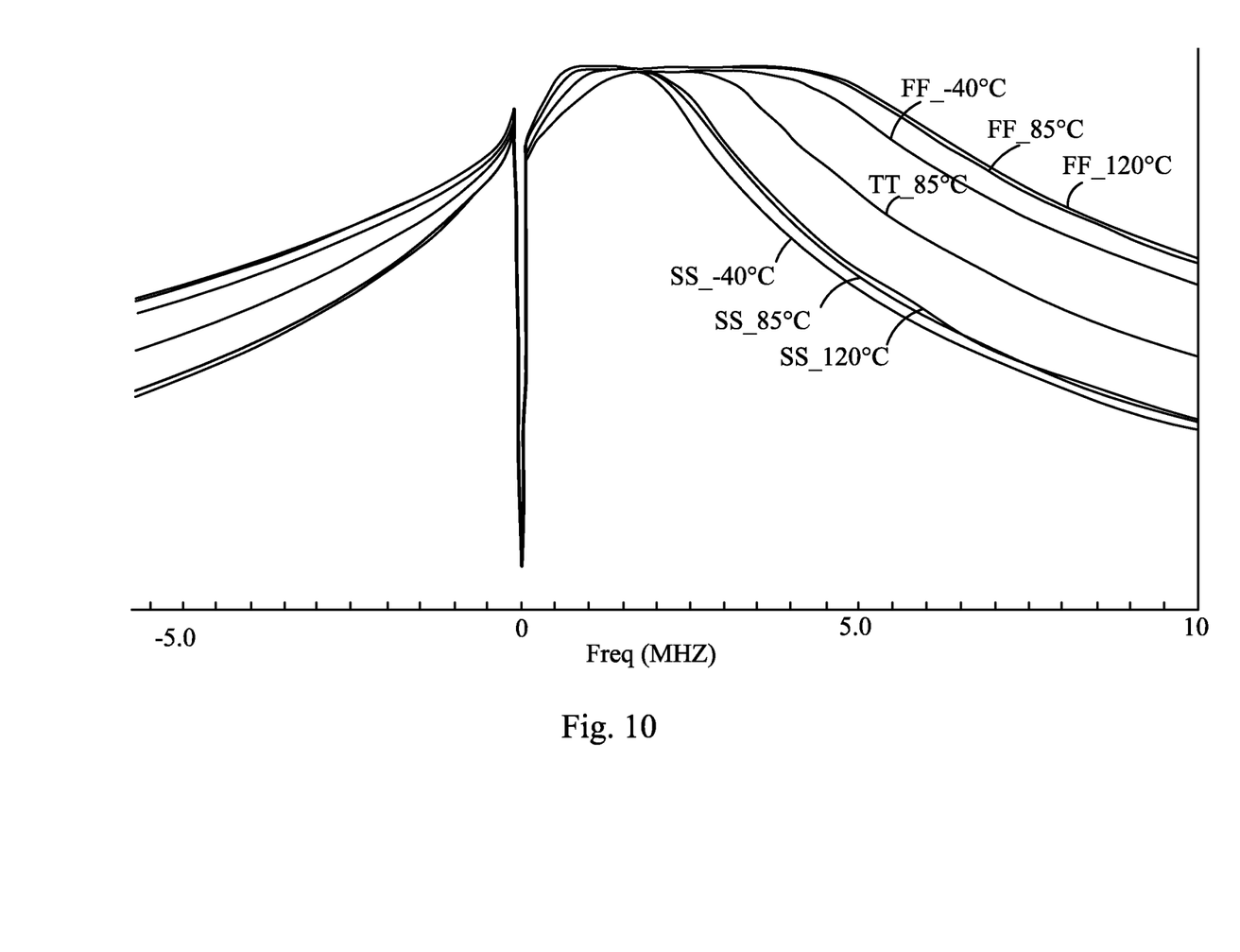
Figure 11:
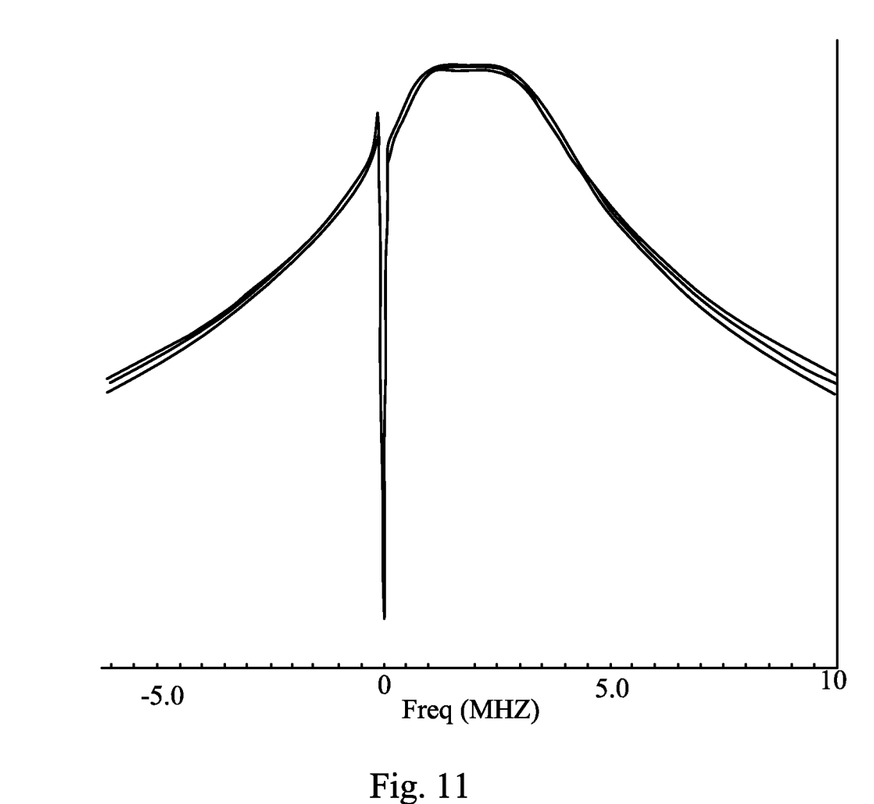

FIGS. 10 and 11 illustrate the AC responses of sample BPFs as shown in FIG. 2. In FIG. 10, a plurality of AC responses corresponding to BPFs at different process corners (fast-fast (FF) corners, slow-slow (SS) corners, and typical-typical (TT) corners) and different temperatures (−40°, 85° C., and 120° C.) are illustrated. The process corners and the temperatures are marked for the respective AC responses. It is observed that the process variations and temperature variations may cause the AC responses to be significantly shifted relative to each other. However, after the calibration using the embodiments, as shown in FIG. 11, the AC responses of the BPFs may all be calibrated to substantially overlap each other, although the individual AC responses are not marked. It is observed that for different BPFs at different process corners and different temperatures, when the calibrations are finished, the respective CAP_CODEs may be different.

Figure 12:
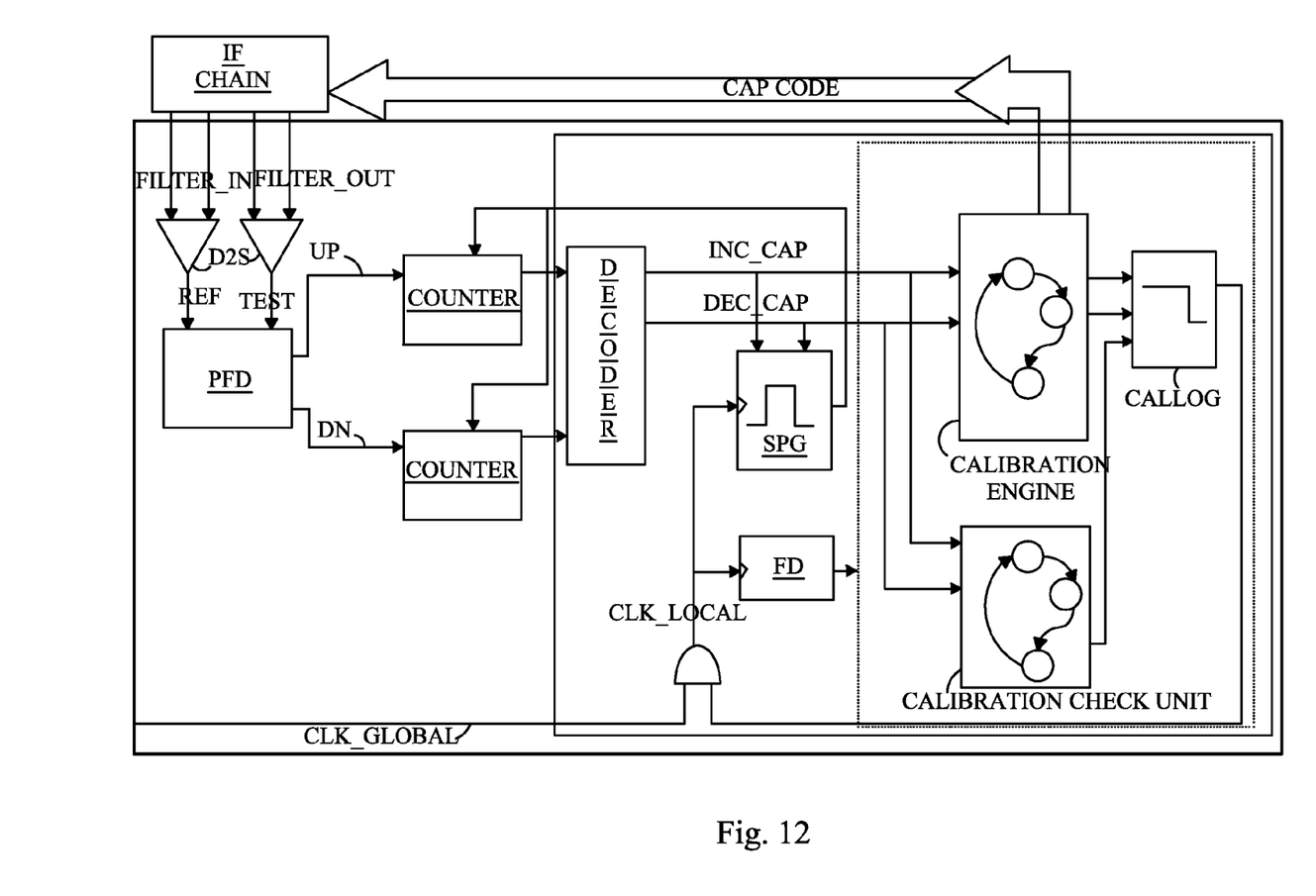
FIG. 12 illustrates a block diagram of a circuit implementing the architecture shown in FIG. 3 in accordance with an alternative embodiment.

FIG. 12 illustrates alternative embodiments that are similar to the embodiments shown in FIG. 4, except the UP and DN pulses are processed differently to generate calibration control bits INC_CAP and DEC_CAP. In these embodiments, counters are used to count the numbers of UP pulses and DN pulses. However, the width of the UP pulses and DN pulses are not measured, and the counters count the UP pulses and DN pulses even if they are narrow pulses. A decoder is then used to compare the numbers of the UP pulses and the DN pulses. If the number of the UP pulses is greater than the number of DN pulses, calibration control bit INC_CAP is set to 1. Otherwise, if the number of the DN pulses is greater than the number of UP pulses, calibration control bit DEC_CAP is set to 1. If the number of the DN pulses is substantially equal to the number of UP pulses, both calibration control bits INC_CAP and DEC_CAP are set to zero. The operation of remaining components of the circuit is essentially the same as shown in FIG. 4, and hence is not discussed herein.

Since the calibration is performed in-situ and is performed directly to the capacitor bank in the core filter that is to be calibrated, and no external capacitor bank is used, there is no intra-die mismatch that will cause mis-calibration. Further, since the calibration is performed using phase comparison rather than the conventional voltage-level comparison, the calibration is more robust and accurate. The power consumption is low since the calibration circuit is stopped after the calibration is finished. Furthermore, the calibration scheme may be adopted for many kinds of filter applications.

In accordance with an embodiment, a method of calibrating a filter includes providing the filter having a capacitor; applying an input signal into the filter to generate an output signal, measuring a phase difference between the input signal and the output signal; determining a leading/lagging status of the phase difference; calculating a CAP_CODE using the leading/lagging status; and calibrating the capacitor using the CAP_CODE.

In accordance with other embodiments, a method of calibrating a filter includes providing the filter including a capacitor bank configured to be operated by a CAP_CODE; inputting a differential input signal into the filter to generate a differential output signal; converting the differential input signal to a reference signal, with the reference signal being single ended; converting the differential output signal to a test signal, with the test signal being single ended; measuring a phase difference between the reference signal and the test signal; and calibrating the capacitor bank in response to the phase difference.

In accordance with yet other embodiments, a method of calibrating a filter includes providing the filter including a capacitor bank configured to be operated by a CAP_CODE; inputting a differential input signal into the filter to generate a differential output signal; converting the differential input signal to a reference signal, with the reference signal being single ended; converting the differential output signal to a test signal, with the test signal being single ended; comparing the reference signal with the test signal using a phase detector; and outputting pulses to a first and a second output of a phase detector in response to a phase difference of the reference signal and the test signal. The method further includes determining calibration control bits from the pulses; calculating the CAP_CODE using the calibration control bits; and calibrating the capacitor bank in response to the CAP_CODE.

In accordance with yet other embodiments, a circuit for calibrating a capacitor in a filter includes a phase detector including a first and a second output, wherein the phase detector is configured to receive an input signal of the filter and an output signal out of the filter; and a calibration control bit generator including inputs coupled to the first and the second outputs of the phase detector. The calibration control bit generator is configured to generate calibration control bits in response to a leading status of the input signal and the output signal. The circuit further includes a CAP_CODE generator including inputs coupled to outputs of the calibration control bit generator, and an output coupled to the capacitor of the filter.

In accordance with yet other embodiments, a circuit for calibrating a capacitor in a filter includes a phase detector having a first and a second output, wherein the phase detector is configured to receive an input signal of the filter and an output signal of the filter, and output pulses to different ones of the first and the second outputs in response to a leading status of phases of the input and the output signals. The circuit further includes a first delay cell having an input coupled to the first output of the phase detector; a first register having a first input coupled to the first output of the phase detector, a second input coupled to an output of the first delay cell, and an output; a second delay cell having an input coupled to the second output of the phase detector; a second register having a first input coupled to the second output of the phase detector, a second input coupled to an output of the second delay cell, and an output; and an FSM including a first input coupled to the output of the first register, a second input coupled to the output of the second register, and an output coupled to the capacitor of the filter Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of calibrating a filter, the method comprising:
applying an input signal into the filter to generate an output signal, wherein the input signal and the output signal have a same frequency, and wherein the input signal is a first differential signal comprising a first pair of complementary signals, and the output signal is a second differential signal comprising a second pair of complementary signals;
measuring a phase difference between the input signal and the output signal, wherein the measuring comprises:
converting the input signal from the first differential signal to a first single-ended digital signal;
converting the output signal from the second differential signal to a second single-ended digital signal;
comparing the first and the second single-ended digital signals to determine the phase difference using a phase detector; and
outputting pulses to a first and a second output of the phase detector in response to the phase difference;
determining a leading/lagging status of the phase difference;
calculating a capacitor code (CAP_CODE) using the leading/lagging status, wherein the leading/lagging status indicates which of the input signal and the output signal leads another one of the input signal and the output signal in phase; and
calibrating the capacitor using the CAP_CODE.

2. The method of claim 1, wherein the filter is a bandpass filter of a receiver.

3. The method of claim 2, wherein the bandpass filter is a part of an intermediate frequency chain of the receiver.

4. The method of claim 1 further comprising repeating the steps starting from the step of inputting the input signal and ending at the step of calibrating the capacitor.

5. The method of claim 4 further comprising, for each of the steps of repeating, recording a respective CAP_CODE, and stopping calibrating the filter when the CAP_CODE does not change in a consecutive sequence of the steps of repeating.

6. The method of claim 1 further comprising:
accumulating a first register for the pulses outputted from the first output of the phase detector and having pulse widths greater than a pre-determined delay time; and
accumulating a second register for the pulses outputted from the second output of the phase detector and having pulse widths greater than the pre-determined delay time, wherein the CAP_CODE is calculated using values in the first and the second registers.

7. The method of claim 1 further comprising:
setting a first calibration control bit to 1 when a number of the pulses outputted from the first output of the phase detector is greater than a number of the pulses outputted from the second output of the phase detector;
setting a second calibration control bit to 1 when a number of the pulses outputted from the second output of the phase detector is greater than a number of the pulses outputted from the first output of the phase detector; and
setting both the first and the second calibration control bits to 0 when a number of the pulses from the first output of the phase detector is equal to a number of the pulses from the second output of the phase detector, wherein values of the first and the second calibration control bits are used in the step of calculating the CAP_CODE.

8. A method of calibrating a filter, the method comprising:
providing the filter comprising a capacitor bank configured to be operated by a capacitor code (CAP_CODE);
inputting a differential input signal into the filter to generate a differential output signal;
converting the differential input signal to a reference signal, with the reference signal being single ended;
converting the differential output signal to a test signal, with the test signal being single ended;
measuring a phase difference between the reference signal and the test signal; and
calibrating the capacitor bank in response to the phase difference.

9. The method of claim 8 further comprising:
increasing the CAP_CODE when the reference signal leads the test signal in phase;
decreasing the CAP_CODE when the reference signal lags the test signal in phase; and
keeping the CAP_CODE unchanged when there is substantially no phase difference between the reference signal and the test signal.

* * * * *